United States Patent
Sano et al.

(10) Patent No.: US 10,991,590 B2
(45) Date of Patent: Apr. 27, 2021

(54) ETCHING METHOD AND PLATING SOLUTION

(71) Applicant: KABUSHIKI KAISHA TOSHIBA, Minato-ku (JP)

(72) Inventors: Mitsuo Sano, Yokohama (JP);
Keiichiro Matsuo, Yokohama (JP);
Susumu Obata, Yokohama (JP);
Kazuhito Higuchi, Yokohama (JP);
Kazuo Shimokawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 11 days.

(21) Appl. No.: 16/359,427

(22) Filed: Mar. 20, 2019

(65) Prior Publication Data
US 2020/0098582 A1 Mar. 26, 2020

(30) Foreign Application Priority Data
Sep. 26, 2018 (JP) .............................. JP2018-180346

(51) Int. Cl.
| | |
|---|---|
| *A61K 9/14* | (2006.01) |
| *B22F 9/00* | (2006.01) |
| *C21B 15/04* | (2006.01) |
| *C22B 5/20* | (2006.01) |
| *C22C 1/04* | (2006.01) |
| *H01L 21/306* | (2006.01) |
| *H01L 21/308* | (2006.01) |
| *H01L 21/033* | (2006.01) |

(52) U.S. Cl.
CPC .... *H01L 21/30604* (2013.01); *H01L 21/3085* (2013.01); *H01L 21/0332* (2013.01); *H01L 21/0335* (2013.01); *H01L 21/0337* (2013.01)

(58) Field of Classification Search
CPC ......... H01L 21/30604; H01L 21/30608; H01L 2224/0346; B22F 9/16; C23C 18/42
See application file for complete search history.

(56) References Cited

U.S. PATENT DOCUMENTS

| | | | |
|---|---|---|---|
| 7,078,276 B1 * | 7/2006 | Zurcher | B22F 9/20 |
| | | | 257/E21.703 |
| 10,090,158 B2 * | 10/2018 | Matsuo | B01J 23/50 |
| 10,224,209 B2 * | 3/2019 | Matsuo | C23F 1/20 |
| 2008/0090074 A1 * | 4/2008 | Matsumura | C23C 18/42 |
| | | | 428/338 |

(Continued)

FOREIGN PATENT DOCUMENTS

| | | |
|---|---|---|
| JP | 10-147884 A | 6/1998 |
| JP | 11-021672 A | 1/1999 |

(Continued)

*Primary Examiner* — Bradley Smith
*Assistant Examiner* — David J Goodwin
(74) *Attorney, Agent, or Firm* — Oblon, McClelland, Maier & Neustadt, L.L.P.

(57) ABSTRACT

According to an embodiment, a method of forming a porous layer includes forming a porous layer containing a noble metal on a surface made of a semiconductor by displacement plating. The plating solution used in the displacement plating contains a noble metal source, hydrogen fluoride, and an adjusting agent adjusting a pH value or zeta potential. The noble metal source produces an ion containing the noble metal in water. The plating solution has a pH value in a range of 1 to 6.

12 Claims, 17 Drawing Sheets

(56) References Cited

U.S. PATENT DOCUMENTS

| | | | |
|---|---|---|---|
| 2010/0248449 A1* | 9/2010 | Hildreth | H01L 21/78 438/460 |
| 2011/0266521 A1 | 11/2011 | Ferrari et al. | |
| 2011/0294255 A1* | 12/2011 | Lin | H01L 31/1804 438/98 |
| 2012/0088372 A1* | 4/2012 | Chien | H01L 31/028 438/753 |
| 2012/0119352 A1* | 5/2012 | Iwai | H05K 3/187 257/734 |
| 2012/0283336 A1* | 11/2012 | Grigorenko | B82Y 30/00 514/769 |
| 2013/0244369 A1* | 9/2013 | Nishimoto | H01L 21/30604 438/71 |
| 2019/0312112 A1* | 10/2019 | Smith | H01L 29/32 |

FOREIGN PATENT DOCUMENTS

| | | |
|---|---|---|
| JP | 2006-265648 A | 10/2006 |
| JP | 2007-308796 A | 11/2007 |
| JP | 2008-177489 A | 7/2008 |
| JP | 2010-209415 A | 9/2010 |
| JP | 2011-101009 A | 5/2011 |
| JP | 2013-527103 A | 6/2013 |
| JP | 2017-118145 A | 6/2017 |
| JP | 2018-018965 A | 2/2018 |

* cited by examiner

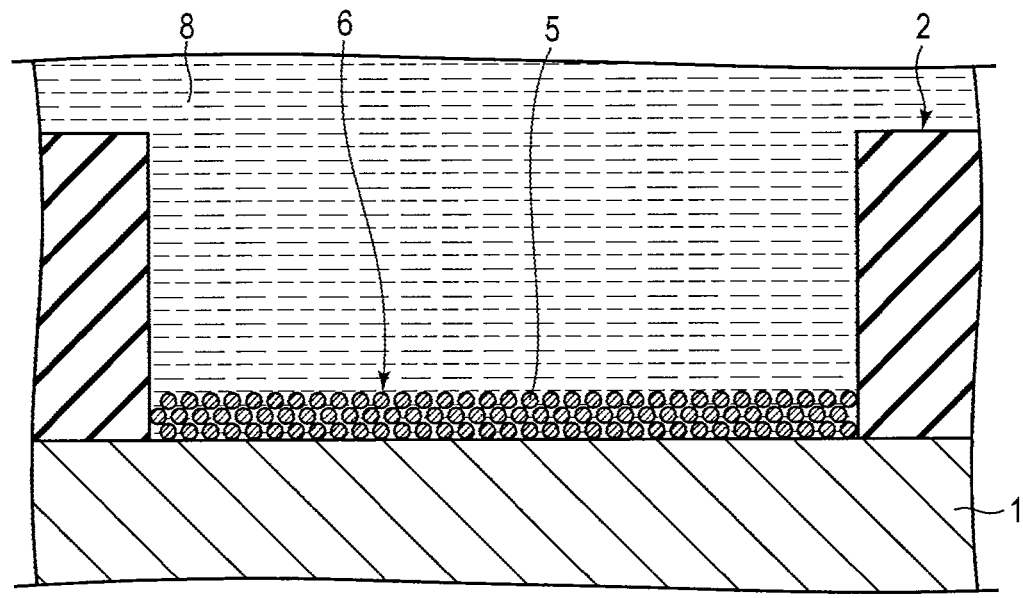
F I G. 3
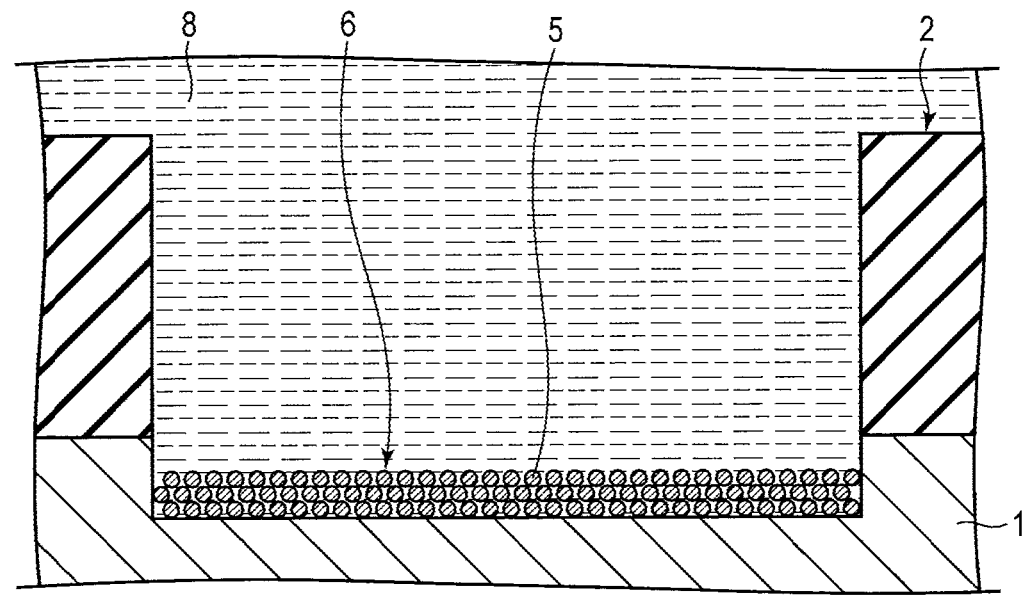
F I G. 4

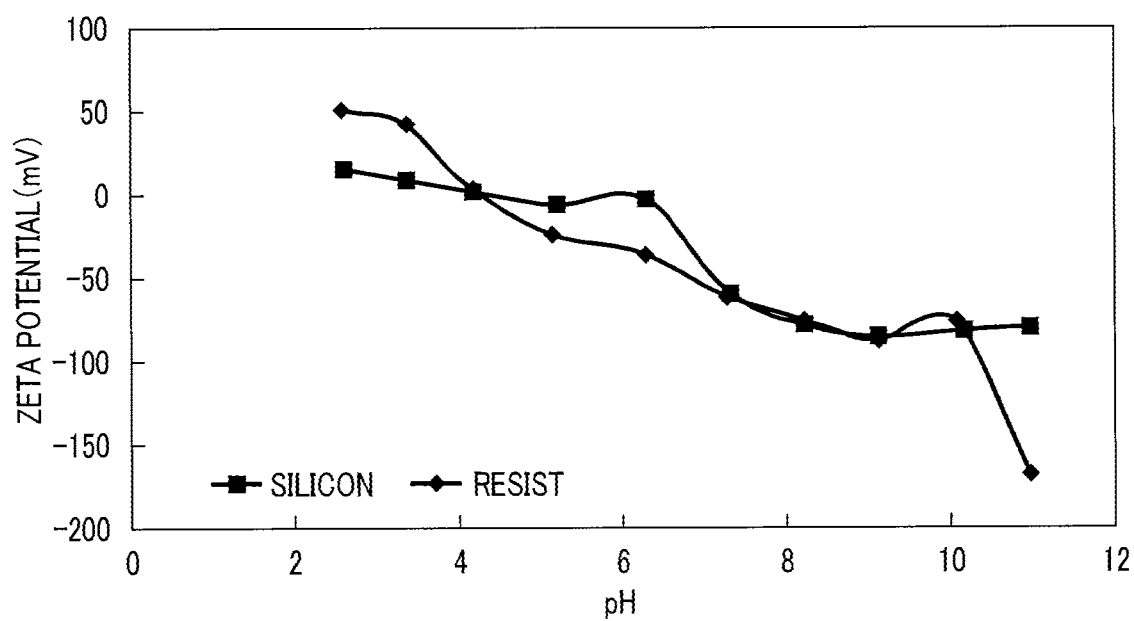
F I G. 10

ETCHING METHOD AND PLATING SOLUTION

CROSS-REFERENCE TO RELATED APPLICATION

This application is based upon and claims the benefit of priority from Japanese Patent Applications No. 2018-180346, filed Sep. 26, 2018, the entire contents of which are incorporated herein by reference.

FIELD

Embodiments described herein generally relate to a method of forming a porous layer, an etching method, a method of manufacturing an article, a method of manufacturing a semiconductor device, and a plating solution.

BACKGROUND

A Metal-Assisted Chemical Etching (MacEtch) method is a method of etching a semiconductor surface using a noble metal as a catalyst. By the MacEtch method, for example, a recessed portion having a high aspect ratio can be formed on a semiconductor substrate.

BRIEF DESCRIPTION OF THE DRAWINGS

FIG. 3 is a sectional view schematically showing a state at the start of an etching process in the etching method according to the embodiment;

FIG. 4 is a sectional view schematically showing a state after a certain period of time has elapsed from the state shown in FIG. 3;

FIG. 10 is a graph showing an example of an influence of a pH value of a standard solution on zeta potential at an interface between a mask layer and the standard solution and zeta potential at an interface between a silicon surface and the standard solution;

DETAILED DESCRIPTION

Figure 1:
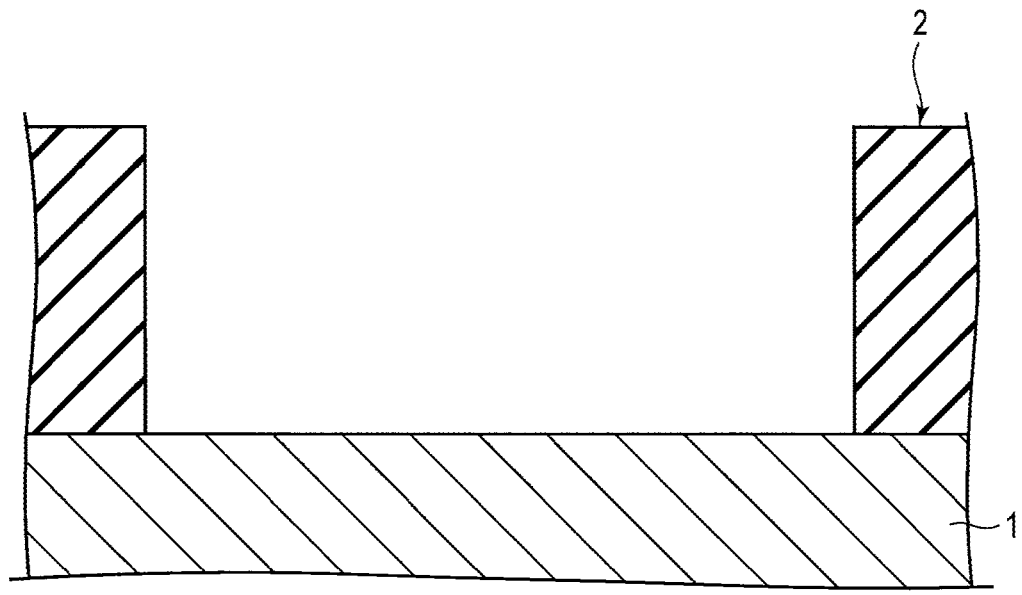
FIG. 1 is a sectional view schematically showing a structure to be etched by an etching method according to an embodiment.

A method of forming a porous layer according to a first aspect comprises forming a porous layer containing a noble metal on a surface made of a semiconductor by displacement plating, a plating solution used in the displacement plating containing a noble metal source, hydrogen fluoride, and an adjusting agent adjusting a pH value or zeta potential, the noble metal source producing an ion containing the noble metal in water, and the plating solution having a pH value in a range of 1 to 6.

An etching method according to a second aspect comprises forming the porous layer on the surface made of the semiconductor by the method according to the first aspect; and bringing an etchant containing an oxidizer and hydrogen fluoride into contact with the surface made of the semiconductor to etch the surface made of the semiconductor under an action of the porous layer as a catalyst.

A method of manufacturing an article according to a third aspect comprises forming the porous layer on the surface made of the semiconductor by the method according to the first aspect; and bringing an etchant containing an oxidizer and hydrogen fluoride into contact with the surface made of the semiconductor to etch the surface made of the semiconductor under an action of the porous layer as a catalyst.

A method of manufacturing a semiconductor device according to a fourth aspect comprises etching a semiconductor substrate by the etching method according to the second aspect.

A method of manufacturing semiconductor chips according to a fifth aspect comprises singulating a semiconductor substrate by the etching method according to the second aspect.

A plating solution according to a sixth aspect is a plating solution for forming a porous layer containing a noble metal on a surface made of a semiconductor by displacement plating and comprises a noble metal source producing an ion containing the noble metal in an aqueous solution; and an adjusting agent adjusting a pH value or zeta potential, wherein the plating solution has a pH value in a range of 1 to 6.

Hereinafter, embodiments are described in detail with reference to drawings. Constituent elements exhibiting the same or similar functions are designated by the same reference numerals throughout the drawings, and overlapping description is omitted.

First, referring to FIGS. 1 to 6, an etching method according to an embodiment is described.

In this method, first, as a substrate, a structure 1 shown in FIG. 1 is prepared.

At least a portion of a surface of the structure 1 is made of a semiconductor. The semiconductor is selected from for example, Si, Ge, semiconductors made of a compound of a Group III element and a Group V element such as GaAs and GaN, and SiC. The term "group" used herein is a group in the short-form periodic table.

The structure 1 is, for example, a semiconductor substrate such as a semiconductor wafer. The semiconductor wafer may be doped with an impurity or may have a semiconductor element such as a transistor or a diode formed thereon. In addition, a main surface of the semiconductor wafer may be in parallel with any crystal plane of the semiconductor.

Herein, as an example, the structure 1 is the semiconductor wafer having a surface made of silicon.

Next, a mask layer 2 is formed on the surface made of silicon of the structure 1.

The mask layer 2 is a layer for forming a porous layer described below as a metal pattern on the surface of the structure 1. The mask layer 2 partially covers the surface of the structure 1 and has an opening. A width of the opening is preferably 0.1 µm or more, and more preferably 0.2 µm or more. The width of the opening may be 1 µm or more. Although, there is no upper limit on the width of the opening, the upper limit may be 300 µm or less according to an example, and may be 10 µm or less according to another example.

As a material of the mask layer 2, any material can be used as long as the material can suppress attachment of a noble metal described below to the region of the surface of the structure 1 that is covered by the mask layer 2. Examples of the materials include organic materials, in particular, organic polymer materials such as polyimide, a fluorine resin, a phenol resin, an acryl resin, and a novolac resin, or inorganic materials such as silicon oxide or silicon nitride.

The mask layer 2 may be formed by, for example, an existing semiconductor process. The mask layer 2 made of an organic material may be formed by, for example, photolithography. The mask layer 2 made of an inorganic material may be formed by, for example, formation of an inorganic material layer by a vapor deposition method, formation of a mask by photolithography, and patterning of the inorganic material layer by etching. Otherwise, the mask layer 2 made of an inorganic material may be formed by oxidation or nitration of a surface region of the structure 1, formation of a mask by photolithography, and patterning of the oxide or nitride layer by etching.

Figure 2:
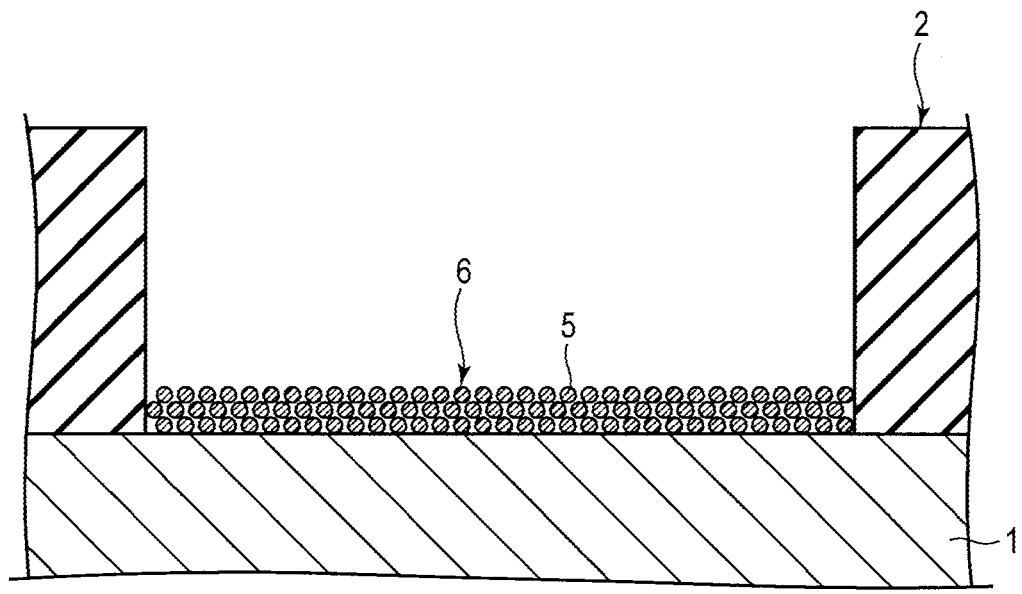
FIG. 2 is a sectional view schematically showing a porous layer-forming process in the etching method according to the embodiment.

Next, as shown in FIG. 2, a porous layer 6 containing a noble metal is formed on the surface made of silicon of the structure 1. The porous layer 6 serves as a catalyst in an oxidation reaction of the silicon surface in contact therewith.

As the noble metal, for example, gold, silver, platinum, palladium, rhodium, ruthenium, or a combination thereof can be used.

The porous layer 6 is, for example, made of gold. The porous layer 6 may further contain one or more noble metals other than gold selected from the group consisting of silver, platinum, palladium, rhodium, and ruthenium, in addition to gold. Here, as an example, the porous layer 6 is made of gold.

The porous layer 6 is herein, a particulate layer formed of an aggregate of particles 5. Each of the particles 5 is drawn to have a spherical shape in the drawings. The particles 5 may have any shapes. Although, the particles 5 are stacked to form a multi-layered structure, the porous layer 6 may have a thickness that is equal to the diameter of the particles 5.

The thickness of the porous layer 6 is preferably in a range of 1 nm to 1,000 nm, and more preferably in a range of 50 nm to 200 nm. When the porous layer 6 is thin, there is a possibility that silicon is not sufficiently etched at the position of a gap between the particles forming the porous layer 6 and silicon remains in a needle shape. In addition, when the porous layer 6 is thin, unity of the porous layer 6 is likely to be lost in the etching process. When the porous layer 6 is thick, there is a possibility that an etchant is not sufficiently supplied to a surface of silicon.

The porous layer 6 is formed by displacement plating.

The displacement plating is a type of electroless plating. The displacement plating performed herein uses a plating solution that includes a noble metal source producing an ion containing the noble metal in water, hydrogen fluoride, and an adjusting agent adjusting a pH value or zeta potential, and has a pH value in a range of 1 to 6. Since the plating solution is for displacement plating, the solution does not contain a reducing agent, unlike the plating solution used in an autocatalytic electroless plating.

The noble metal source producing an ion containing the noble metal in water is, for example, a gold source producing an ion containing gold. As the gold source, for example, gold sulfate or a non-cyan type source such as a gold source producing a tetrachloroaurate (III) ion in water is preferred. The gold source producing the tetrachloroaurate (III) ion in water is, for example, tetrachloroauric (III) acid or a tetrachloroaurate (III) such as potassium tetrachloroaurate (III). These compounds or the tetrachloroaurate (III) ion is more stable than gold sulfate in a range of low pH values.

A concentration of the noble metal source in the plating solution is preferably in a range of 0.0001 mol/L to 0.01 mol/L, and more preferably in a range of 0.0005 mol/L to 0.005 mol/L. When the concentration is higher or lower than the range, it is difficult for the noble metal to be deposited in a form of particles.

Hydrogen fluoride serves to remove an oxidation film from a silicon surface, as described below. Herein, as an example, the structure 1 has a surface made of silicon, and the noble metal source is the gold source producing a tetrachloroaurate (III) ion.

In the displacement plating, oxidation of silicon and reduction of gold contained in the tetrachloroauric (III) acid ion occur, resulting in precipitation of gold on the silicon surface. However, a silicon oxide produced in the reaction passivates silicon.

Hydrogen fluoride reacts with silicon oxide to produce $SiF_6^{2-}$, $H^+$, and water. That is, hydrogen fluoride removes a passivation film from the silicon surface. As such, hydrogen fluoride prevents deposition of gold from promptly stopping.

A concentration of hydrogen fluoride in the displacement plating solution is preferably in a range of 0.5 to 10 mol/L, and more preferably 1 to 5 mol/L. When the concentration of hydrogen fluoride is low, deposition of the noble metal is likely to promptly stop. When the concentration of hydrogen fluoride is high, dissolution of the semiconductor surface proceeds, which is likely to adversely affect etching.

The adjusting agent adjusts the pH value of the plating solution or adjusts zeta potential at an interface between the mask layer 2 and the plating solution (a sliding surface near the mask layer 2).

As the adjusting agent, for example, an organic additive can be used. The organic additive may be selected from, for example, polymeric additives such as polyethylene glycol, a polycarboxylate salt, and salts of naphthalenesulfonic acid-formalin condensate; nonionic surfactants such as sorbitan fatty acid ester, sucrose fatty acid ester, polyoxyethylene alkyl ether, polyoxyethylene alkyl phenyl ether, and polyoxyethylene polyoxypropylene glycol; anionic surfactants such as polyoxyethylene alkyl ether carboxylate, sodium dodecyl sulfate, and sodium alkyl benzene sulfonate; and a combination thereof.

When the organic additive is a polymer compound such as polyethylene glycol, the average molecular weight is preferably in a range of 200 to 500,000, more preferably in a range of 1,000 to 100,000, and more preferably in a range of 6,000 to 20,000. When the organic additive is a polymer compound, the average molecular weight is a weight average molecular weight. When the organic additive is a polymer compound and the average molecular weight thereof is small, the effect of suppressing attachment of the particle 5 to an undesired position is small. When the average molecular weight is large, a linear chain structure is long and thus causes steric hindrance, which makes the suppressing effect large.

The concentration of the organic additive in the plating solution is preferably in a range of 0.0001 to 10% by mass, more preferably in a range of 0.0005 to 5% by mass, more preferably in a range of 0.001 to 1% by mass, and still more preferably in a range of 0.001 to 0.01% by mass. When the concentration of the organic additive is low, the effect of suppressing attachment of the particle 5 to an undesired position is small. When the concentration of the organic additive is excessively high, an influence of the concentration on the shape of the particle 5 becomes large.

As the adjusting agent, an inorganic additive may be used. As the inorganic additive, for example, ammonium fluoride, ammonia, sodium hydroxide, potassium hydroxide, and the like can be used.

The inorganic additive is used at a concentration so that zeta potential at an interface between the mask layer 2 and the plating solution is preferably in a range of a negative value or in a range of 10 to −10 mV, and more preferably in a range of 0 to −100 mV.

As such, the plating solution has a pH value in a range of 1 to 6. It is preferred that the pH value of the plating solution is in a range of 4 to 6. When the pH value is lower, zeta potential at an interface between the mask layer 2 and the plating solution tends to be higher. When the pH value is higher, the amount of protons in the solution is decreased, and thus, the zeta potential is shifted to a minus direction.

A temperature of a plating bath is preferably in a range of 0 to 50° C., and more preferably in a range of 15 to 35° C.

The displacement plating is finished before growth of the porous layer 6 exceeds a width of the opening of the mask layer 2. For example, the displacement plating is finished when a certain time period has elapsed since the structure 1 is brought into contact with the plating solution, or when the thickness of the porous layer 6 reaches a predetermined value.

After the displacement plating is finished, the structure 1 is washed. Then, the structure 1 is dried. For example, when the structure 1 has a disc shape, the structure 1 is dried with rotation.

Next, as shown in FIG. 3, the structure 1 on which the mask layer 2 and the porous layer 6 are formed is immersed in an etchant 8.

The etchant 8 contains hydrofluoride acid and an oxidizer. A concentration of hydrogen fluoride in the etchant 8 is preferably in a range of 1 to 15 mol/L, more preferably in a range of 5 to 10 mol/L, and still more preferably in a range of 3 to 8 mol/L. When the concentration of hydrogen fluoride is low, it is difficult to achieve a high etching rate. When the concentration of hydrogen fluoride is high, excessive side etching is likely to occur.

The oxidizer can be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$, and $K_2Cr_2O_7$. Since hydrogen peroxide does not produce harmful by-products and does not cause contamination of the semiconductor element, hydrogen peroxide is preferred as the oxidizer.

A concentration of the oxidizer in the etchant 8 is preferably in a range of 0.2 to 8 mol/L, more preferably in a range of 1 to 4 mol/L, and still more preferably in a range of 2 to 4 mol/L. When the concentration is low, it is difficult to achieve a high etching rate. When the concentration is excessively high, an excessive side etching is likely to occur.

Figure 5:
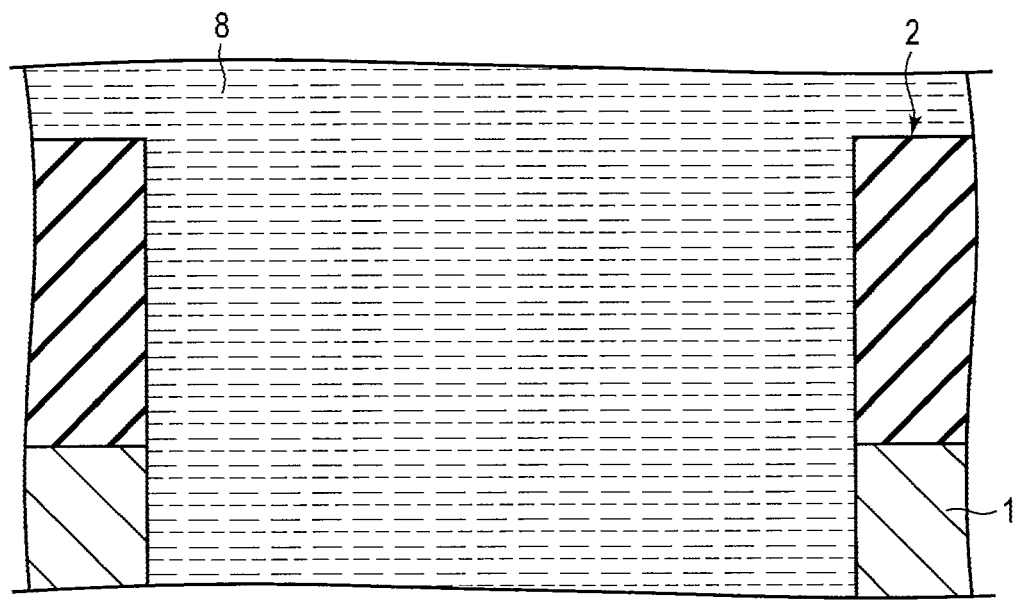
FIG. 5 is a sectional view schematically showing a state after a longer period of time has elapsed from the state shown in FIG. 3.

When the etchant 8 is brought into contact with the structure 1, the semiconductor is oxidized only on a region of the surface of the structure 1 that is adjacent to the particle 5, and hydrofluoride acid dissolves and removes the oxide thus produced. Thus, only a part adjacent to the particle 5 is selectively etched. The particle 5 is not chemically changed and moves downward while etching proceeds, and the same etching as the above is performed thereon. As a result, as shown in FIGS. 4 and 5, etching proceeds in a direction perpendicular to the surface of the structure 1 at a portion of the surface of the structure 1 that corresponds to the porous layer 6.

Thereafter, etching is finished. That is, the structure 1 is pulled up from the etchant 8 and then washed. Next, the structure 1 is dried. For example, when the structure 1 has a disc shape, the structure 1 is dried with rotation.

Figure 6:
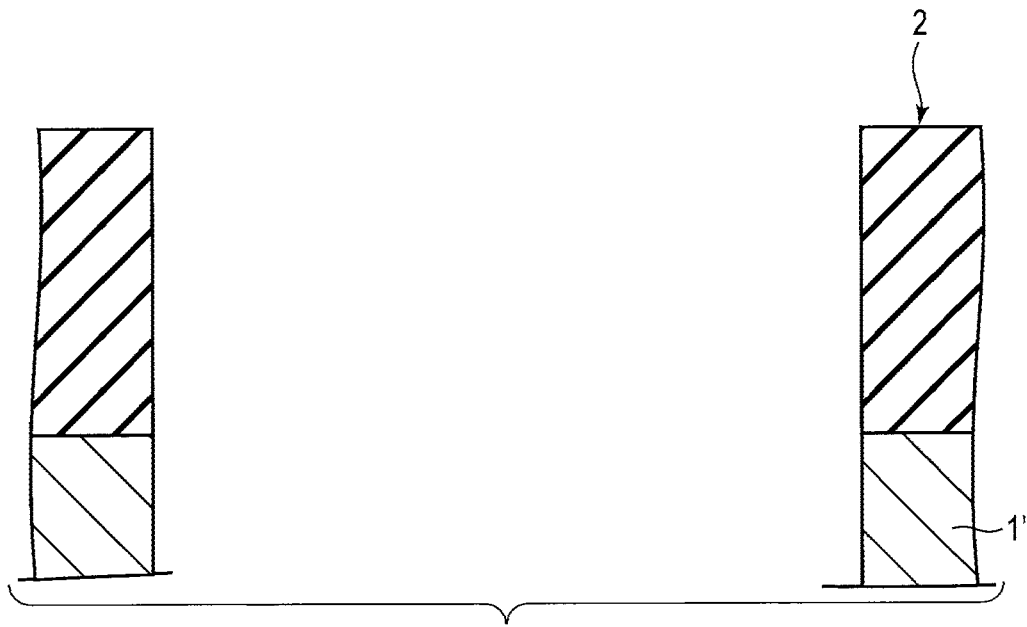
FIG. 6 is a sectional view schematically showing a structure etched by the etching method according to the embodiment.

In this way, a structure 1' shown in FIG. 6 is obtained. The mask layer 2 may be removed or not be removed from the structure 1'.

According to the method described above, attachment of the particle 5 to an undesired position, which occurs during the formation of the porous layer 6, can be suppressed. This will be described below.

Figure 7:
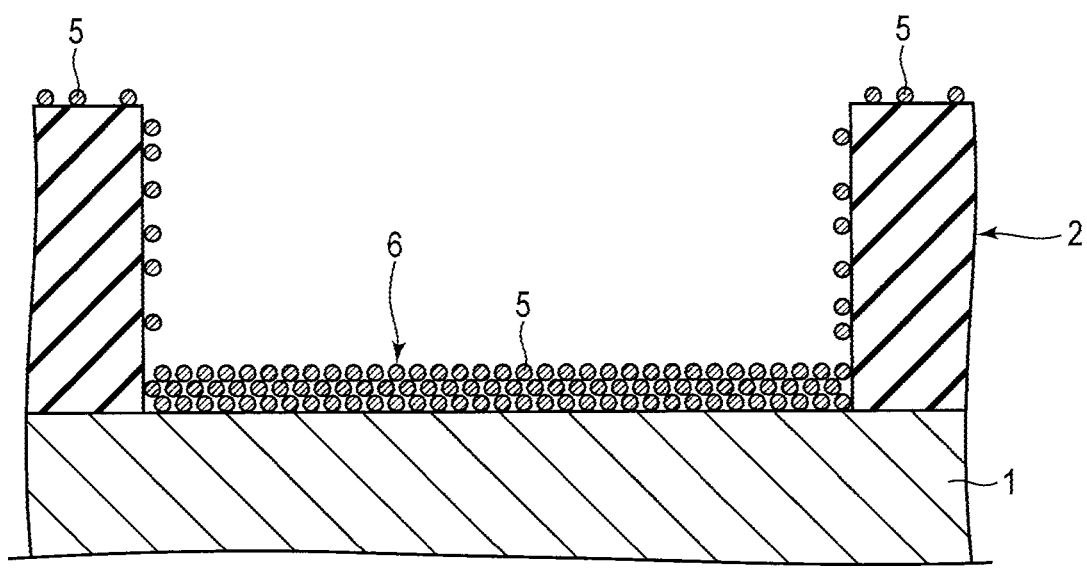
FIG. 7 is a sectional view schematically showing a porous layer-forming process in an etching method according to a Comparative Example.

FIG. 7 is a sectional view schematically showing a porous layer-forming process of the etching method according to the Comparative Example.

When the adjusting agent is omitted from the plating solution, some of the particles 5 are attached to the surface of the mask layer 2 as shown in FIG. 7. When the mask layer 2 is removed, the particles 5 on the mask layer 2 can be attached to the surface of the structure 1'.

In the Comparative Example, the reason why it is easy for some of the particles 5 to be attached to the surface of the mask layer 2 is considered to be as follows. Herein, as an example, the noble metal source is a gold source producing a tetrachloroaurate (III) ion in water.

Figure 8:
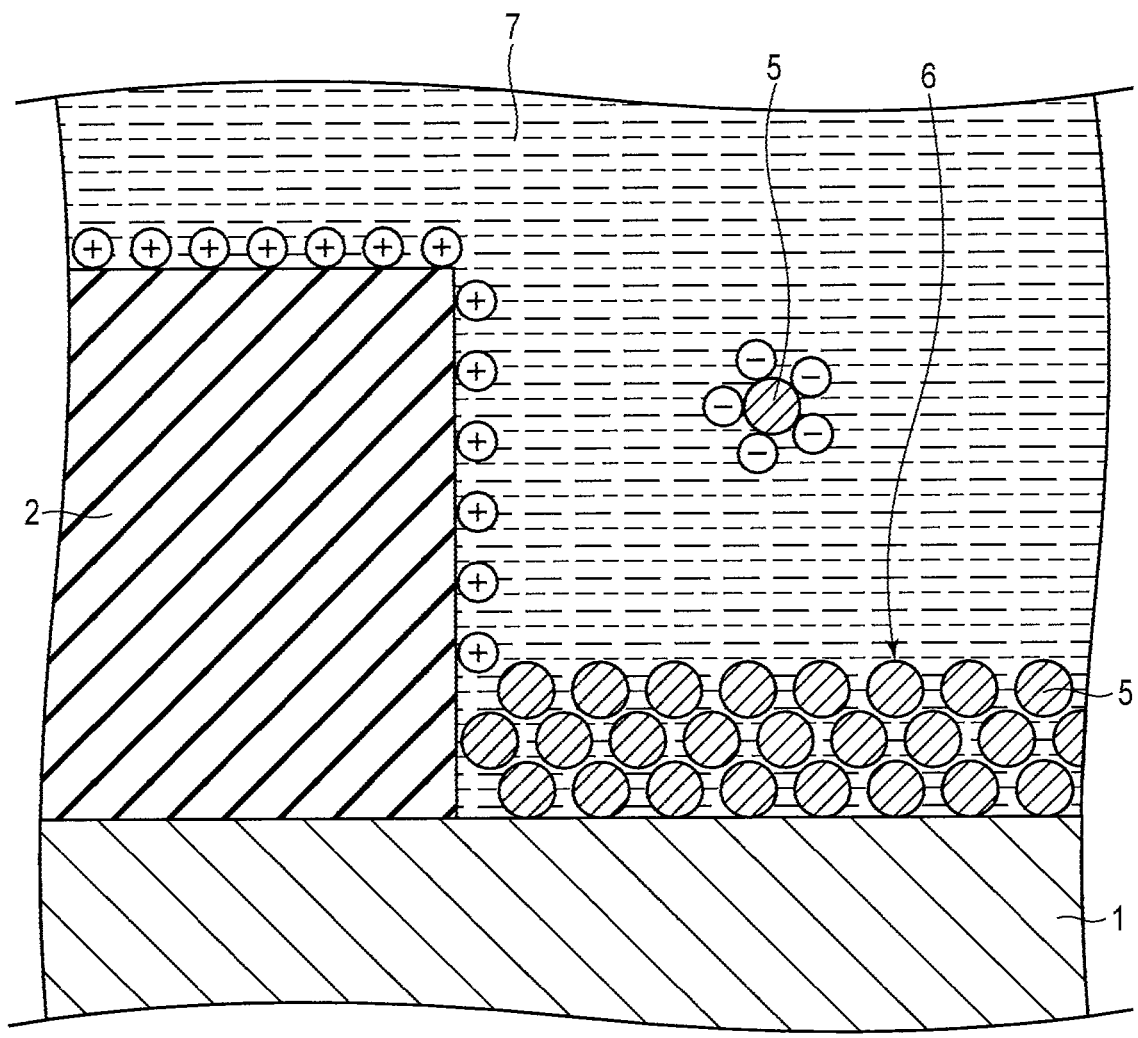
FIG. 8 is a sectional view schematically showing a reason why it is easy for particles containing gold to be attached to a mask layer, in the porous layer-forming process of the etching method according to the Comparative Example.

FIG. 8 is a sectional view schematically showing the reason why it is easy for particles containing gold to be attached to a mask layer, in the porous layer-forming process of the etching method according to the Comparative Example.

Since the plating solution 7 contains hydrogen fluoride, protons are present at a high concentration in the plating solution. Therefore, zeta potential at an interface between the mask layer 2 and the plating solution 7 has a positive value.

On the other hand, in the process of the displacement plating, some of the particles 5 adsorb unreacted tetrachloroaurate (III) ions to be dispersed in the plating solution 7. The zeta potential at the interface between such a particle 5 and the plating solution 7 (a sliding surface near the particle 5) has a negative value.

As such, the zeta potential at the interface between the mask layer 2 and the plating solution 7 is of opposite polarity to the zeta potential at the interface between the particle 5 and the plating solution 7. Therefore, in the Comparative Example, some of the particles 5 are adsorbed by the mask layer 2.

Figure 9:
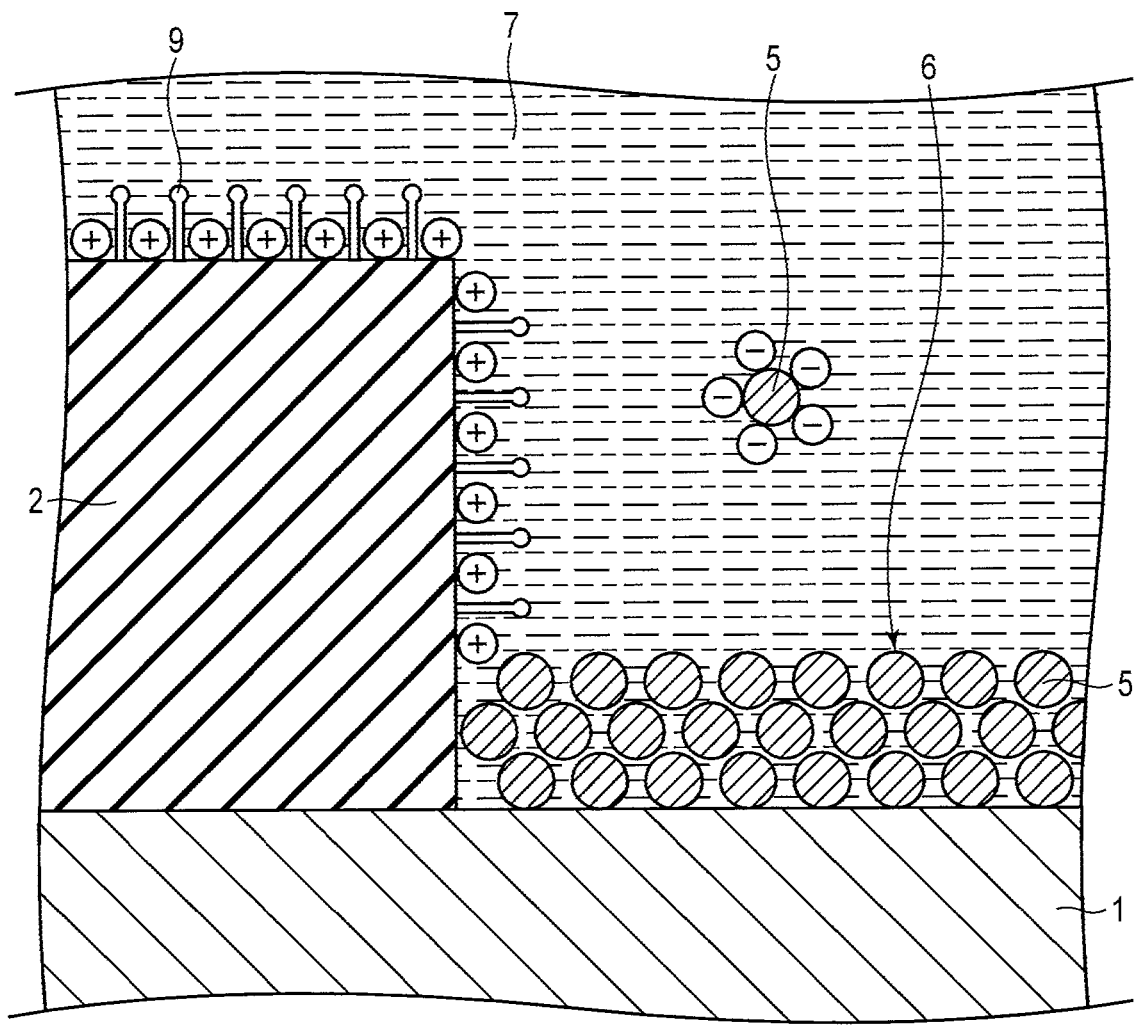
FIG. 9 is a sectional view schematically showing a reason why it is difficult for particles containing gold to be attached to a mask layer, in the porous layer-forming process of the etching method according to the embodiment.

FIG. 9 is a sectional view schematically showing a reason why it is difficult for particles containing gold to be attached to a mask layer, in the porous layer-forming process of the etching method according to the embodiment.

When the plating solution 7 contains an anionic surfactant 9 as the adjusting agent, at least a portion of the anionic surfactant 9 is adsorbed by the mask layer 2. The anionic surfactant 9 is adsorbed by the mask layer 2 so that a hydrophilic portion is positioned on a side of the mask layer 2 and a hydrophobic portion is positioned on a side of the plating solution 7. As a result, the zeta potential at the interface between the mask layer 2 and the plating solution 7 is decreased. For example, a polarity of the zeta potential at the interface between the mask layer 2 and the plating solution 7 changes from positive to negative. On the other hand, a polarity of the zeta potential at the interface between the particle 5 and the plating solution 7 remains negative. Accordingly, the particle 5 repels for example, the mask layer 2, and thus, it is difficult for adsorption by the mask layer 2 to occur.

When the plating solution 7 contains a polymeric additive such as polyethylene glycol or a nonionic surfactant as the adjusting agent, at least a portion of polyethylene glycol or the nonionic surfactant is adsorbed by the mask layer 2. Polyethylene glycol or the nonionic surfactant behaves like an obstacle which interferes with adsorption of the particle 5 by the mask layer 2. Accordingly, in this case also, it is difficult for adsorption of the particle 5 by the mask layer 2 to occur.

Even in the case where the adjusting agent has a function to adjust the pH value of the plating solution 7, adsorption of the particle 5 by the mask layer 2 can be suppressed. This will be described in the following. Herein, as an example, the surface of the structure 1 is made of silicon, the mask layer 2 is made of an organic polymer (resist), and the noble metal source is a gold source producing a tetrachloroaurate (III) ion in water.

FIG. 10 is a graph showing an example of an influence of a pH value of a standard solution on zeta potential at an interface between a mask layer and a standard solution and zeta potential at an interface between a silicon surface and a standard solution. In the drawing, the abscissa represents a pH value of the etchant and the ordinate represents zeta potential. FIG. 10 shows an example in which an aqueous potassium chloride solution is used as the standard solution.

In FIG. 10, as is clear from a curve indicated as "resist", when the pH value of the etchant is increased, the zeta potential at the interface between the mask layer and the plating solution is decreased. As described above, when the zeta potential at the interface between the mask layer and the plating solution is decreased, it is difficult for adsorption of the particle 5 by the mask layer 2 to occur. Accordingly, in this case also, the adsorption of the particle 5 by the mask layer 2 can be suppressed.

The etching method as described above can be used in the manufacture of various articles. For example, the etching method can be used in the manufacture of a semiconductor device, a circuit board such as an interposer, or a stamper used in nanoimprinting. The etching method can also be used in the manufacture of a substrate such as a protective substrate that has a recessed portion on one main surface thereof and form a hollow structure when bonded to another substrate.

The etching method can be used in the formation of a recessed portion such as a trench or a through-hole such as a via hole. In addition, the etching method can be used in division of a structure such as a substrate.

As an example, a method of singulating a semiconductor substrate, for example, a method of dividing a semiconductor wafer into a plurality of semiconductor chips will be described.

In this method, a structure described with reference to FIG. 1 is prepared. Herein, the structure 1 is a semiconductor wafer having a semiconductor element formed on a surface region thereof. The mask layer 2 covers the region of the surface of the structure 1 on which the semiconductor element is formed. The opening of the mask layer 2 has the same shape as the outline of the semiconductor chip. A dicing sheet can be attached to the other surface of the structure 1 on which the mask layer 2 is not provided.

Next, as shown in FIG. 2, the porous layer 6 is formed on the structure 1. Subsequently, as shown in FIGS. 3 to 5, the structure 1 is etched using the etchant 8 containing a hydrofluoride acid and an oxidizer. In this way, the structures 1' shown in FIG. 6 is obtained as semiconductor chips.

EXAMPLES

Hereinafter, specific examples will be described.

[Example 1 (Comparative Example)]

On one surface of a silicon wafer, a resist pattern was formed using photolithography.

Next, a porous layer was formed by a displacement plating method on the surface of the silicon wafer at a position corresponding to an opening of the resist pattern. As the plating solution, an aqueous solution containing tetrchloroaurate (III) tetrahydrate and hydrogen fluoride was used. A concentration of tetrchloroaurate (III) acid and a concentration of hydrogen fluoride in the plating solution were 0.003 mol/L and 1 mol/L, respectively. A plating treatment was performed at a temperature of 20° C. for 3 minutes.

After the plating treatment, the silicon wafer on which the resist pattern and the porous layer were formed was washed, and subsequently dried.

Thereafter, a part of the surface of the silicon wafer corresponding to the opening of the resist pattern was observed by a scanning microscope. As a result, it was confirmed that the porous layer was formed on the part.

In addition, photographs of an upper surface of the resist pattern were taken using the scanning electron microscope. The photographs were taken for randomly selected three fields of view, and for each field of view, the number of gold particles present in a rectangular region having a width of 0.75 μm and a length of 1.7 μm was counted. Then, the arithmetic mean of the numbers of these gold particles was calculated. The results are shown in FIG. 11 and Table 1.

Figure 11:
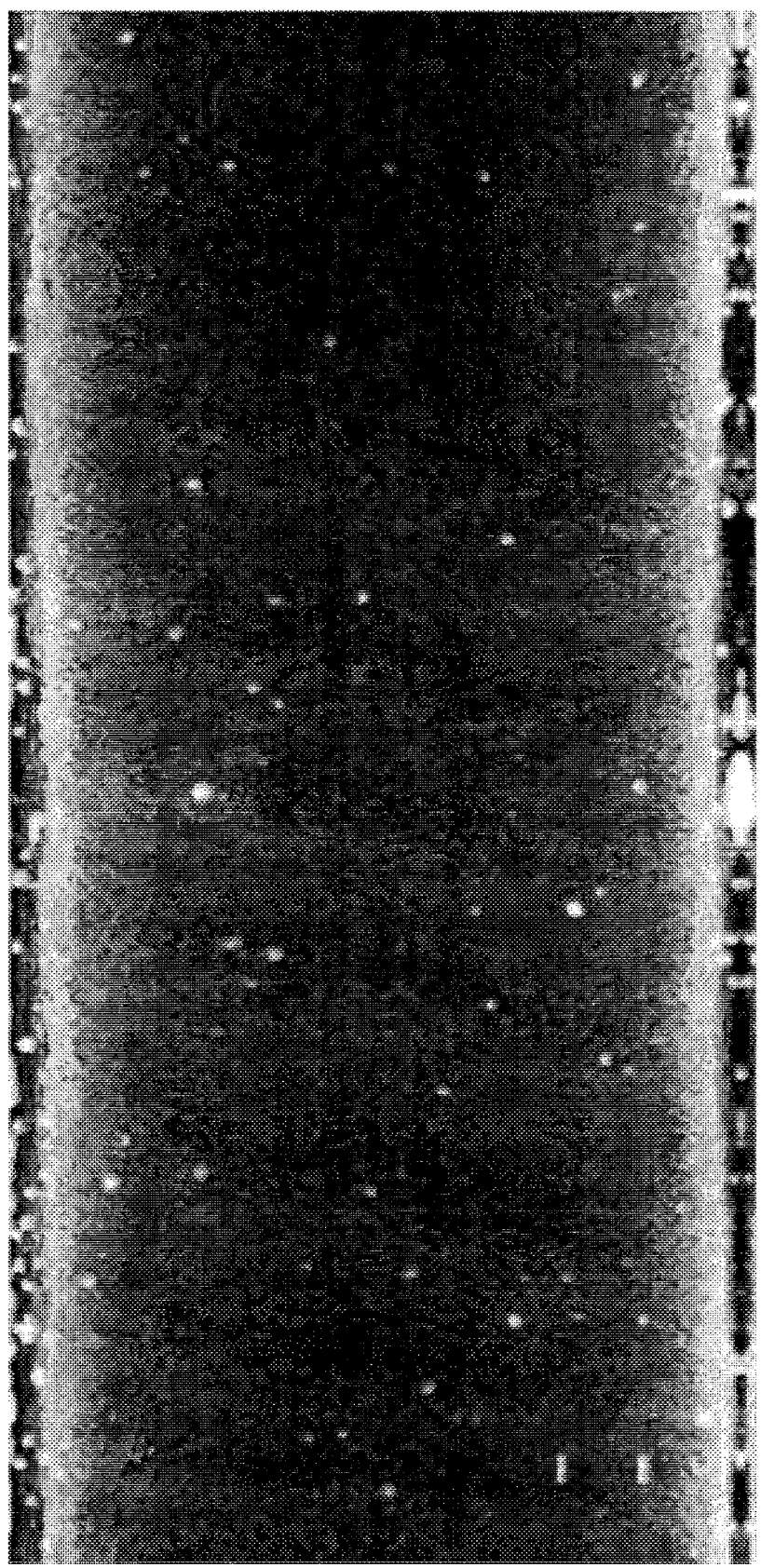
FIG. 11 is an electron microscope photograph showing an example of particles containing gold attached to a mask layer, in a case of using a plating solution which does not contain polyethylene glycol.

FIG. 11 is an electron microscope photograph showing an example of the porous layer obtained by using the plating solution which does not contain polyethylene glycol.

As shown in FIG. 11 and Table 1, when the plating solution which does not contain polyethylene glycol is used, a plurality of gold particles was attached to the resist pattern.

[Example 2]

A porous layer was formed in the same manner as in Example 1, except that an aqueous solution containing tetrchloroaurate (III) tetrahydrate, hydrogen fluoride, and polyethylene glycol was used as a plating solution. The concentration of tetrchloroauric (III) acid and the concentration of hydrogen fluoride in the plating solution were 0.003 mol/L and 1 mol/L, respectively. As the polyethylene glycol, polyethylene glycol having an average molecular weight of 200 was used, and the concentration thereof in the plating solution was 0.0001% by mass. Thereafter, as in Example 1, photographs of the upper surface of the resist pattern were taken using the scanning electron microscope and the number of gold particles was determined. The results are shown in FIG. 12 and Table 1.

Figure 12:
FIG. 12 is an electron microscope photograph showing an example of particles containing gold attached to a mask layer, in a case of using a plating solution containing polyethylene glycol having an average molecular weight of 200 at a concentration of 0.0001% by mass.

FIG. 12 is an electron microscope photograph showing an example of the porous layer obtained by using a plating solution containing polyethylene glycol having an average molecular weight of 200 at a concentration of 0.0001% by mass.

As is clear from a comparison of Example 1 and Example 2, by adding polyethylene glycol to the plating solution, the number of gold particles attached to the resist pattern was decreased.

[Example 3]

A porous layer was formed in the same manner as in Example 2, except that the concentration of polyethylene glycol in the plating solution was 0.001% by mass.

Thereafter, a part of the surface of a silicon wafer corresponding to an opening of a resist pattern was observed by the scanning microscope. As a result, it was confirmed that a porous layer was formed on this part.

In addition, as in Example 1, photographs of the upper surface of the resist pattern were taken using the scanning electron microscope and the number of gold particles was determined. The results are shown in FIG. 13 and Table 1.

Figure 13:
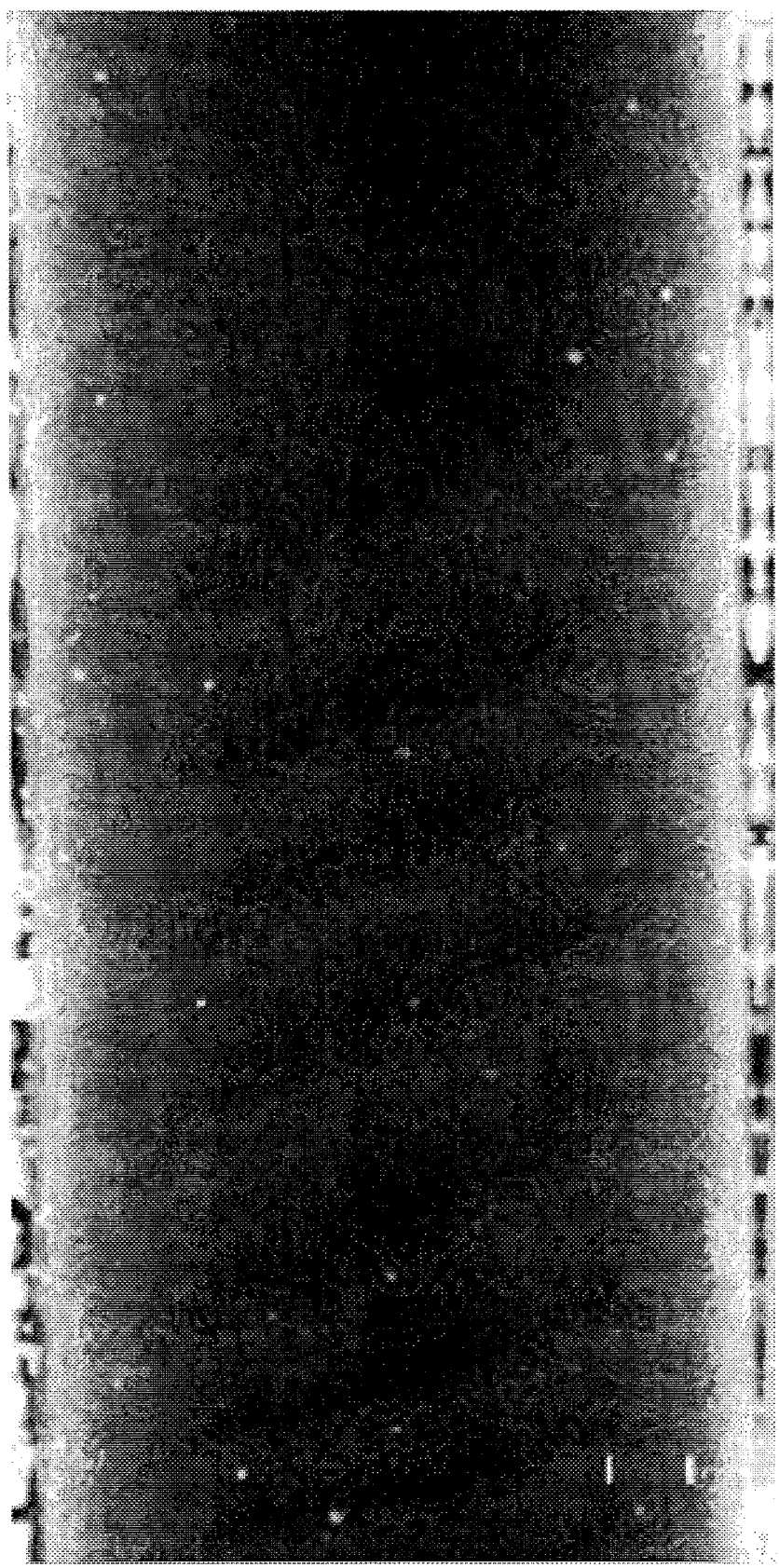
FIG. 13 is an electron microscope photograph showing an example of particles containing gold attached to a mask layer, in a case of using a plating solution containing polyethylene glycol having an average molecular weight of 200 at a concentration of 0.001% by mass.

FIG. 13 is an electron microscope photograph showing an example of the porous layer obtained by using the plating solution containing polyethylene glycol having an average molecular weight of 200 at a concentration of 0.001% by mass.

As is clear from a comparison of Example 2 and Example 3, by increasing the concentration of polyethylene glycol in the plating solution from 0.0001% by mass to 0.001% by mass, the number of gold particles attached to the resist pattern was greatly decreased.

[Example 4]

A porous layer was formed in the same manner as in Example 2, except that the concentration of polyethylene glycol in the plating solution was 1% by mass.

Thereafter, a part of the surface of a silicon wafer corresponding to an opening of a resist pattern was observed by the scanning microscope. As a result, it was confirmed that a porous layer was formed on this part.

Figure 17:
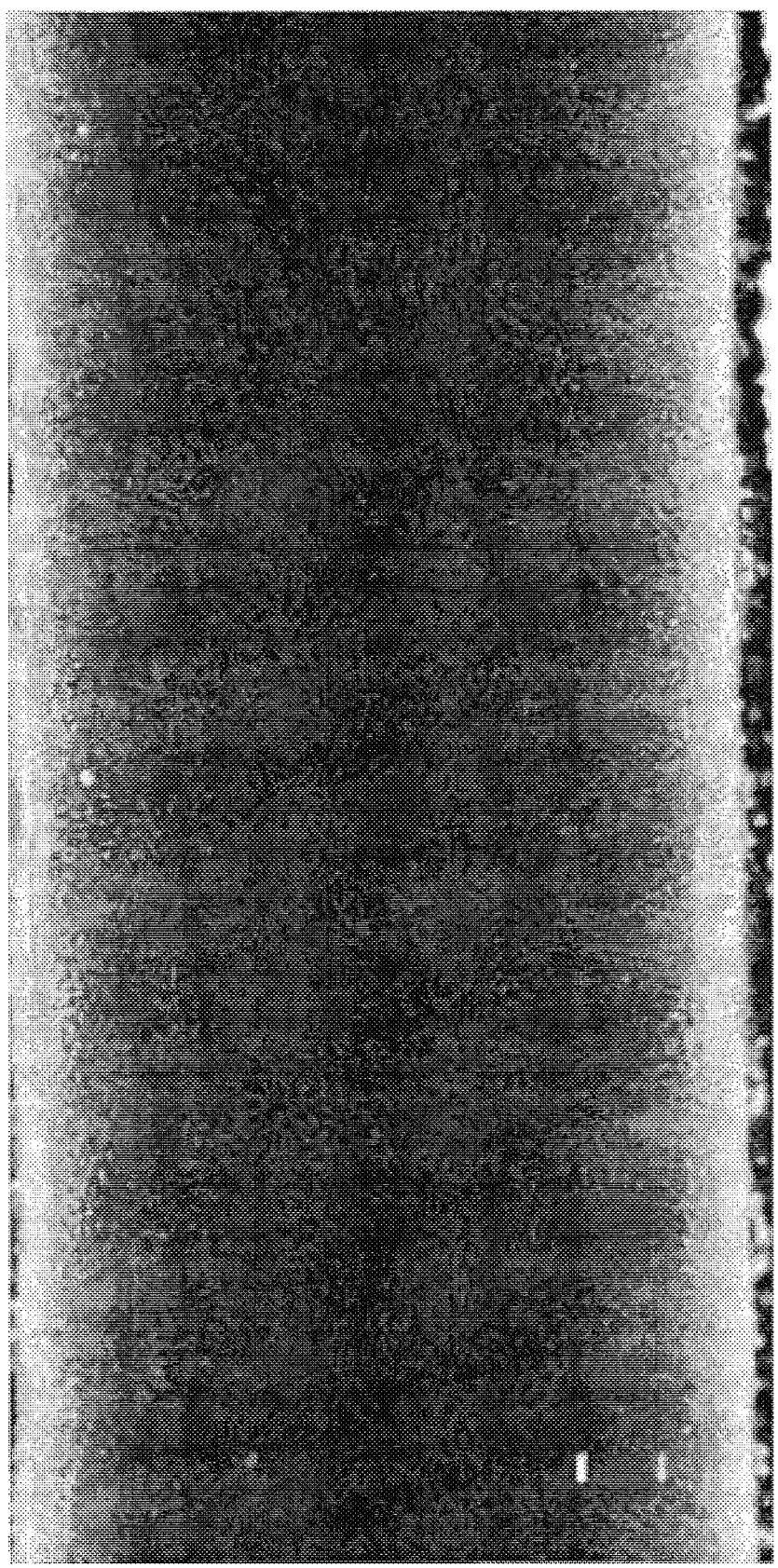
FIG. 17 is an electron microscope photograph showing an example of particles containing gold attached to a mask layer, in a case of using a plating solution containing polyethylene glycol having an average molecular weight of 6,000 at a concentration of 1% by mass.

In addition, as in Example 1, photographs of the upper surface of the resist pattern were taken using the scanning electron microscope and the number of gold particles was determined. The results are shown in FIG. 17 and Table 1.

Figure 14:
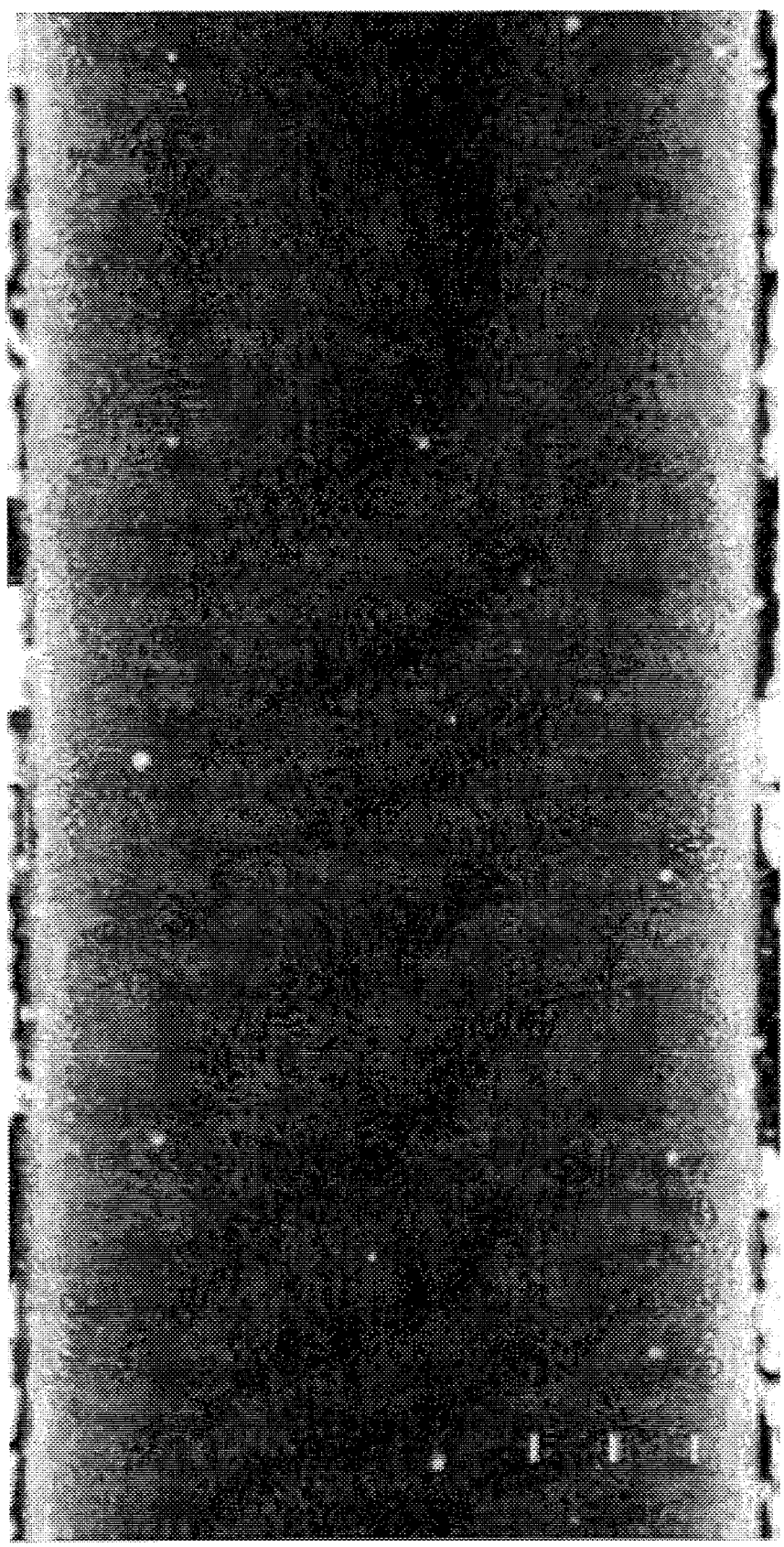
FIG. 14 is an electron microscope photograph showing an example of particles containing gold attached to a mask layer, in a case of using a plating solution containing polyethylene glycol having an average molecular weight of 200 at a concentration of 1% by mass.

FIG. 14 is an electron microscope photograph showing an example of the porous layer obtained by using the plating solution containing polyethylene glycol having an average molecular weight of 200 at a concentration of 1% by mass.

As is clear from a comparison of Example 3 and Example 4, even in the case of increasing the concentration of polyethylene glycol in the plating solution from 0.001% by mass to 1% by mass, the number of gold particles attached to the resist pattern was not decreased.

[Example 5]

A porous layer was formed in the same manner as in Example 2, except that the average molecular weight of polyethylene glycol was 6,000.

Thereafter, a part of the surface of a silicon wafer corresponding to an opening of a resist pattern was observed by the scanning microscope. As a result, it was confirmed that a porous layer was formed on this part.

In addition, as in Example 1, photographs of the upper surface of the resist pattern were taken using the scanning electron microscope and the number of gold particles was determined. The results are shown in FIG. 15 and Table 1.

Figure 15:
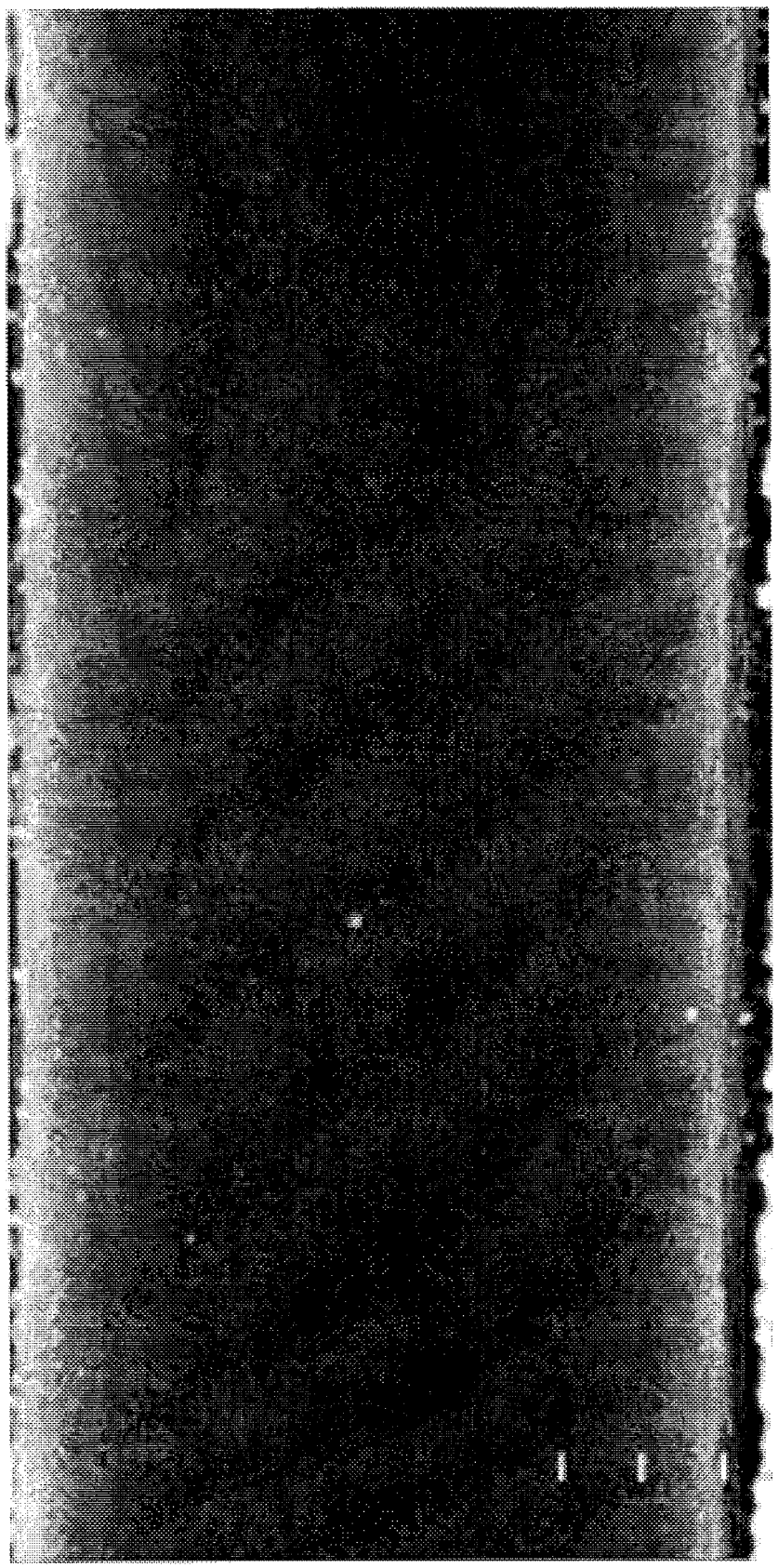
FIG. 15 is an electron microscope photograph showing an example of particles containing gold attached to a mask layer, in a case of using a plating solution containing polyethylene glycol having an average molecular weight of 6,000 at a concentration of 0.0001% by mass.

FIG. 15 is an electron microscope photograph showing an example of the porous layer obtained by using the plating solution containing polyethylene glycol having an average molecular weight of 6,000 at a concentration of 0.0001% by mass.

As is clear from a comparison of Example 2 and Example 5, by increasing the average molecular weight of polyethylene glycol from 200 to 6,000, the number of gold particles attached to the resist pattern was greatly decreased.

[Example 6]

A porous layer was formed in the same manner as in Example 5, except that the concentration of polyethylene glycol in the plating solution was 0.001% by mass.

Thereafter, a part of the surface of a silicon wafer corresponding to an opening of a resist pattern was observed by the scanning microscope. As a result, it was confirmed that a porous layer was formed on this part.

In addition, as in Example 1, photographs of the upper surface of the resist pattern were taken using the scanning electron microscope and the number of gold particles was determined. The results are shown in FIG. 16 and Table 1.

Figure 16:
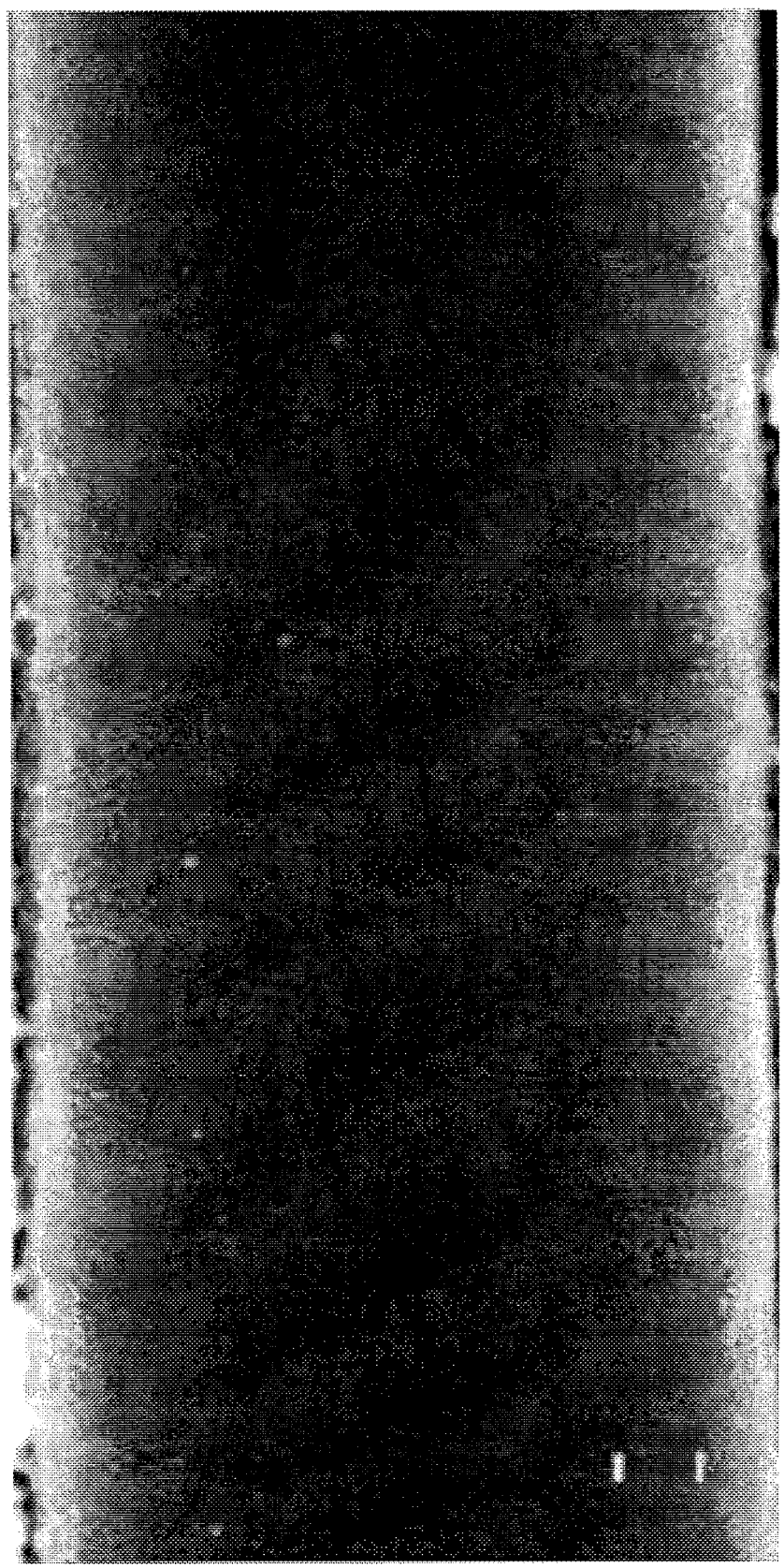
FIG. 16 is an electron microscope photograph showing an example of particles containing gold attached to a mask layer, in a case of using a plating solution containing polyethylene glycol having an average molecular weight of 6,000 at a concentration of 0.001% by mass.

FIG. 16 is an electron microscope photograph showing an example of the porous layer obtained by using the plating solution containing polyethylene glycol having an average molecular weight of 6,000 at a concentration of 0.001% by mass.

As is clear from a comparison of Example 5 and Example 6, by increasing the concentration of polyethylene glycol in the plating solution from 0.0001% by mass to 0.001% by mass, the number of gold particles attached to the resist pattern was greatly decreased.

In addition, as is clear from a comparison of Example 3 and Example 6, by increasing the average molecular weight of polyethylene glycol from 200 to 6,000, the number of gold particles attached to the resist pattern was greatly decreased.

[Example 7]

A porous layer was formed in the same manner as in Example 5, except that the concentration of polyethylene glycol in the plating solution was 1% by mass.

Thereafter, a part of the surface of a silicon wafer corresponding to an opening of a resist pattern was observed by the scanning microscope. As a result, it was confirmed that a porous layer was formed on this part.

In addition, as in Example 1, photographs of the upper surface of the resist pattern were taken using the scanning electron microscope and the number of gold particles was determined. The results are shown in FIG. 14 and Table 1.

FIG. 17 is an electron microscope photograph showing an example of the porous layer obtained by using the plating solution containing polyethylene glycol having an average molecular weight of 6,000 at a concentration of 1% by mass.

As is clear from a comparison of Example 6 and Example 7, even in the case of increasing the concentration of polyethylene glycol in the plating solution from 0.001% by mass to 1% by mass, the number of gold particles attached to the resist pattern was not greatly decreased.

However, as is clear from a comparison of Example 4 and Example 7, by increasing the average molecular weight of polyethylene glycol from 200 to 6,000, the number of gold particles attached to the resist pattern was greatly decreased.

[Example 8]

A porous layer was formed in the same manner as in Example 2, except that the average molecular weight of polyethylene glycol was 20,000.

Thereafter, a part of the surface of a silicon wafer corresponding to an opening of a resist pattern was observed by the scanning microscope. As a result, it was confirmed that a porous layer was formed on this part.

In addition, as in Example 1, photographs of the upper surface of the resist pattern were taken using the scanning electron microscope and the number of gold particles was determined. The results are shown in FIG. 18 and Table 1.

Figure 18:
FIG. 18 is an electron microscope photograph showing an example of particles containing gold attached to a mask layer, in a case of using a plating solution containing polyethylene glycol having an average molecular weight of 20,000 at a concentration of 0.0001% by mass.

FIG. 18 is an electron microscope photograph showing an example of the porous layer obtained by using the plating solution containing polyethylene glycol having an average molecular weight of 20,000 at a concentration of 0.0001% by mass.

As is clear from a comparison of Example 5 and Example 8, by increasing the average molecular weight of polyethylene glycol from 6,000 to 20,000, the number of gold particles attached to the resist pattern was decreased.

[Example 9]

A porous layer was formed in the same manner as in Example 8, except that the concentration of polyethylene glycol in the plating solution was 0.001% by mass.

Thereafter, a part of the surface of a silicon wafer corresponding to an opening of a resist pattern was observed by the scanning microscope. As a result, it was confirmed that a porous layer was formed on this part.

In addition, as in Example 1, photographs of the upper surface of the resist pattern were taken using the scanning electron microscope and the number of gold particles was determined. The results are shown in FIG. 19 and Table 1.

Figure 19:
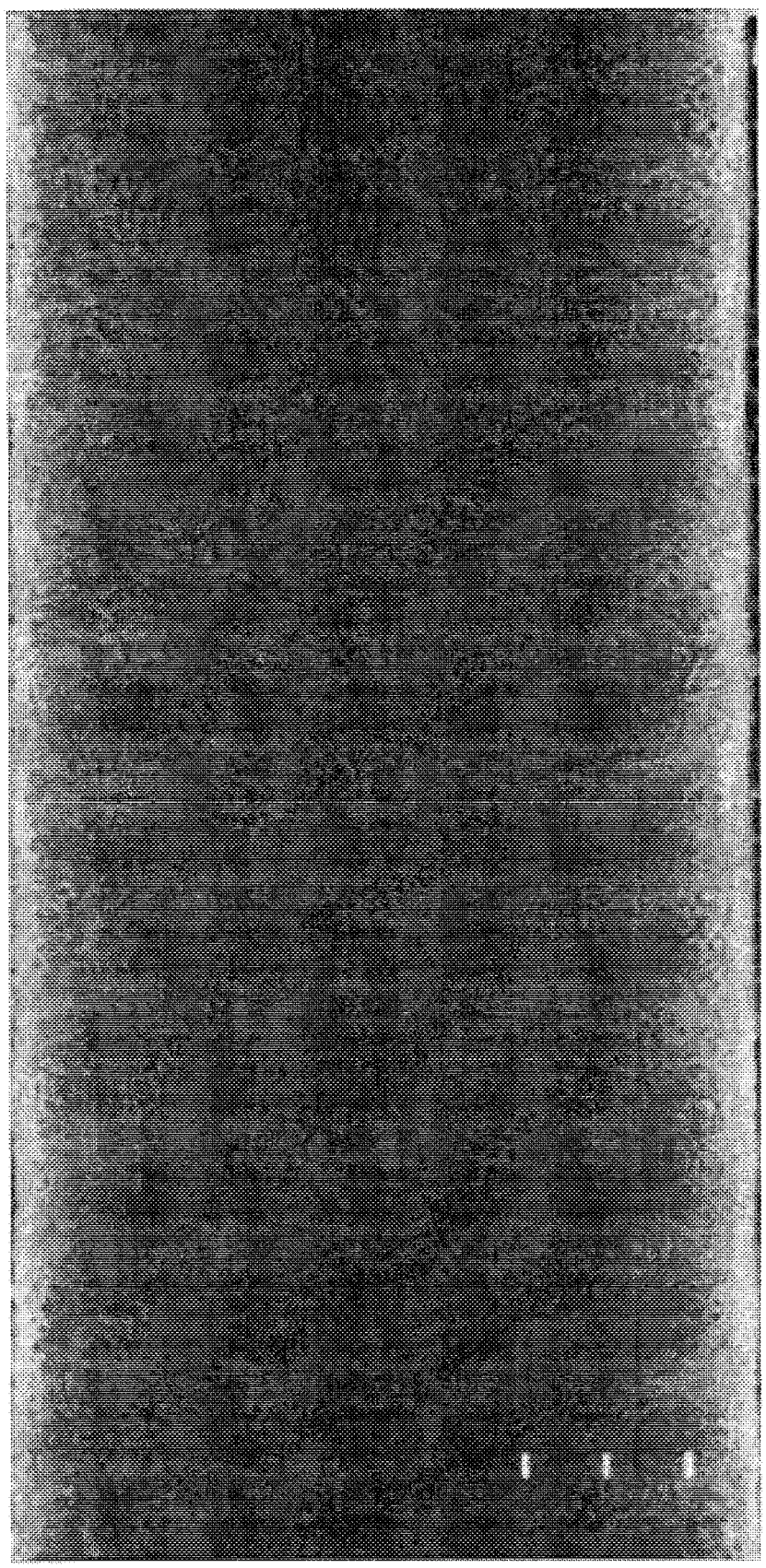
FIG. 19 is an electron microscope photograph showing an example of particles containing gold attached to a mask layer, in a case of using a plating solution containing polyethylene glycol having an average molecular weight of 20,000 at a concentration of 0.001% by mass.

FIG. 19 is an electron microscope photograph showing an example of the porous layer obtained by using the plating solution containing polyethylene glycol having an average molecular weight of 20,000 at a concentration of 0.001% by mass.

As is clear from a comparison of Example 8 and Example 9, by increasing the concentration of polyethylene glycol in the plating solution from 0.0001% by mass to 0.001% by mass, the number of gold particles attached to the resist pattern was greatly decreased.

In addition, as is clear from a comparison of Example 6 and Example 9, by increasing the average molecular weight of polyethylene glycol from 6,000 to 20,000, the number of gold particles attached to the resist pattern was decreased.

[Example 10]

A porous layer was formed in the same manner as in Example 8, except that the concentration of polyethylene glycol in the plating solution was 1% by mass.

Thereafter, a part of the surface of a silicon wafer corresponding to an opening of a resist pattern was observed by the scanning microscope. As a result, it was confirmed that a porous layer was formed on this part.

In addition, as in Example 1, photographs of the upper surface of the resist pattern were taken using the scanning electron microscope and the number of gold particles was determined. The results are shown in FIG. 20 and Table 1.

Figure 20:
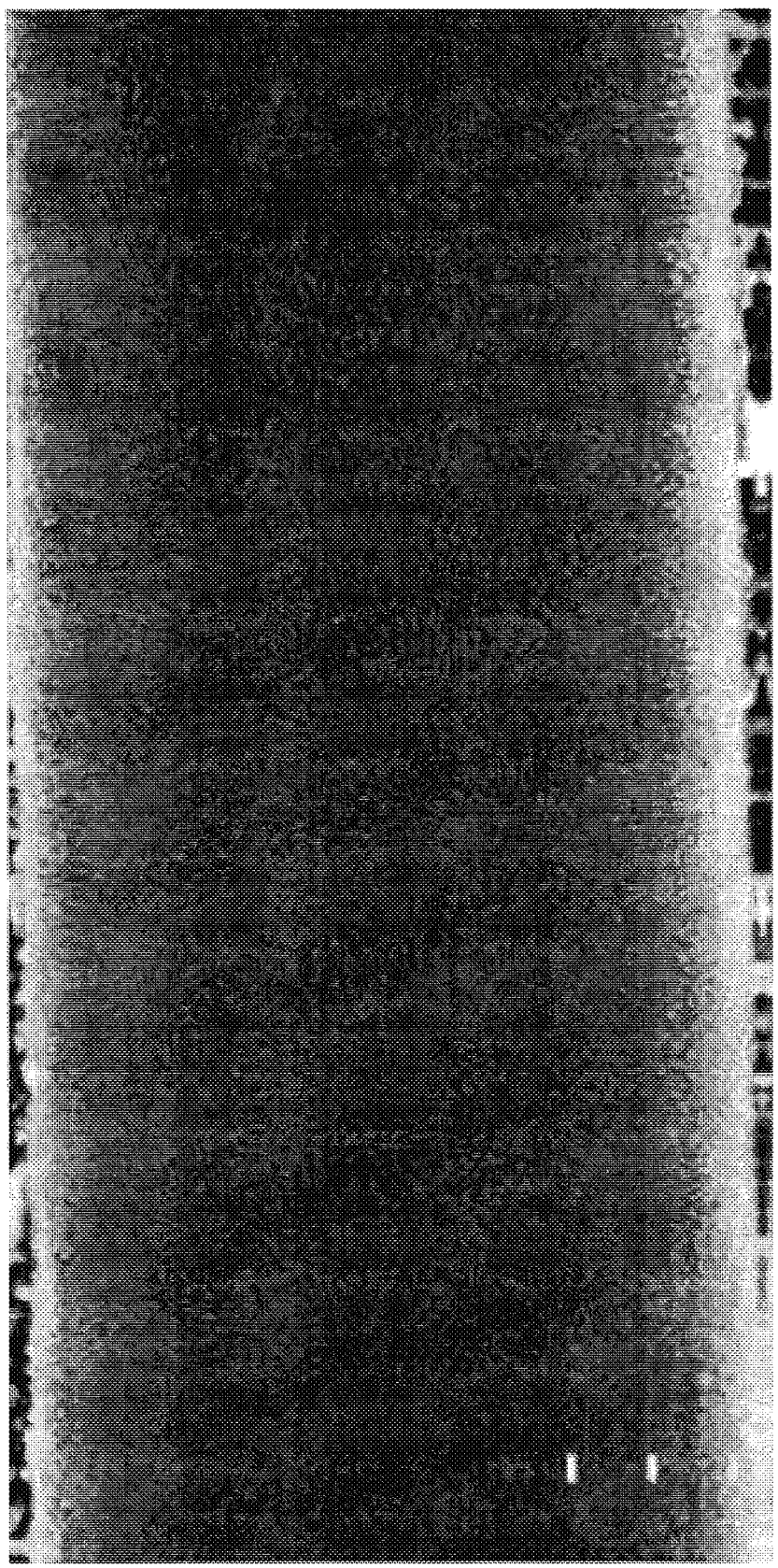
FIG. 20 is an electron microscope photograph showing an example of particles containing gold attached to a mask layer, in a case of using a plating solution containing polyethylene glycol having an average molecular weight of 20,000 at a concentration of 1% by mass.

FIG. 20 is an electron microscope photograph showing an example of the porous layer obtained by using the plating solution containing polyethylene glycol having an average molecular weight of 20000 at a concentration of 1% by mass.

As is clear from a comparison of Example 9 and Example 10, even in the case of increasing the concentration of polyethylene glycol in the plating solution from 0.001% by mass to 1% by mass, the number of gold particles attached to the resist pattern was not greatly decreased.

In addition, as is clear from a comparison of Example 7 and Example 10, by increasing the average molecular weight of polyethylene glycol from 6,000 to 20,000, the number of gold particles attached to the resist pattern was decreased.

TABLE 1

| | Polyethylene glycol | | |
| --- | --- | --- | --- |
| | Average molecular weight | Concentration (% by mass) | Number of gold particles |
| Example 1 | — | 0 | 66 |
| Example 2 | 200 | 0.0001 | 64 |
| Example 3 | 200 | 0.001 | 22 |
| Example 4 | 200 | 1 | 24 |
| Example 5 | 6,000 | 0.0001 | 13 |
| Example 6 | 6,000 | 0.001 | 4 |
| Example 7 | 6,000 | 1 | 3 |
| Example 8 | 20,000 | 0.0001 | 9 |
| Example 9 | 20,000 | 0.001 | 1 |
| Example 10 | 20,000 | 1 | 1 |

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method of forming a porous layer, comprising:

forming a mask layer on one main surface of a substrate such that the main surface is partially covered by the mask layer; and thereafter, forming a porous layer comprising a noble metal on a surface made of a semiconductor by displacement plating, a plating solution used in the displacement plating comprising a noble metal source, hydrogen fluoride, and an adjusting agent adjusting a pH value or zeta potential, the noble metal source producing an ion comprising the noble metal in water, and the plating solution having a pH value in a range of 1 to 6, wherein the surface made of the semiconductor is a region of the main surface not covered by the mask layer, the adjusting agent comprises at least one of a nonionic surfactant and an anionic surfactant or a polymeric additive, and the zeta potential at an interface between the mask layer and the plating solution is in a range of 0 to −100 mV.

2. The method according to claim 1, wherein the semiconductor comprises silicon.

3. The method according to claim 1, wherein the noble metal includes gold.

4. The method according to claim 1, wherein the adjusting agent comprises at least one of the nonionic surfactant and the anionic surfactant.

5. The method according to claim 1, wherein the adjusting agent comprises the polymeric additive.

6. The method according to claim 5, wherein the plating solution comprises polyethylene glycol having an average molecular weight in a range of 1,000 to 100,000 as the polymeric additive.

7. The method according to claim 5, wherein the plating solution comprises polyethylene glycol as the polymeric additive at a concentration of 0.0005 to 5% by mass.

8. The method according to claim 1, wherein the adjusting agent further comprises one or more selected from the group consisting of ammonium fluoride, ammonia, sodium hydroxide, and potassium hydroxide.

9. The method according to claim 1, wherein the plating solution has the pH value in a range of 4 to 6.

10. An etching method comprising:

forming the porous layer on the surface made of the semiconductor by the method according to claim 1; and bringing an etchant containing an oxidizer and hydrogen fluoride into contact with the surface made of the semiconductor to etch the surface made of the semiconductor under an action of the porous layer as a catalyst.

11. A method of manufacturing a semiconductor device, comprising etching a semiconductor substrate by the etching method according to claim 10.

12. A method of manufacturing semiconductor chips, comprising singulating a semiconductor substrate by the etching method according to claim 10.

* * * * *